(12) United States Patent
Kato

(10) Patent No.: US 8,306,375 B2
(45) Date of Patent: Nov. 6, 2012

(54) WAVELENGTH-TUNABLE OPTICAL TRANSMITTER

(75) Inventor: Tomoaki Kato, Tokyo (JP)

(73) Assignee: NEC Corporation, Tokyo (JP)

(*) Notice: Subject to any disclaimer, the term of this patent is extended or adjusted under 35 U.S.C. 154(b) by 123 days.

(21) Appl. No.: 13/057,248

(22) PCT Filed: Mar. 27, 2009

(86) PCT No.: PCT/JP2009/056326
§ 371 (c)(1),
(2), (4) Date: Feb. 2, 2011

(87) PCT Pub. No.: WO2010/016295
PCT Pub. Date: Feb. 11, 2010

(65) Prior Publication Data
US 2011/0135251 A1    Jun. 9, 2011

(30) Foreign Application Priority Data
Aug. 6, 2008  (JP) .................. 2008-203042

(51) Int. Cl.
G02B 6/12  (2006.01)
G02B 26/00  (2006.01)
H01S 3/10  (2006.01)
H04B 10/02  (2006.01)

(52) U.S. Cl. .......... 385/14; 385/1; 385/2; 385/3; 385/4; 385/5; 385/8; 385/9; 385/10; 359/237; 359/238; 359/247; 359/248; 359/260; 372/4; 372/20; 372/43.01; 372/93; 398/134; 398/135; 398/136; 398/137; 398/138; 398/139

(58) Field of Classification Search ............... 385/1–5, 385/8–10, 14; 359/237–238, 247–248, 260; 372/4, 20, 43.01, 93; 398/134–139
See application file for complete search history.

(56) References Cited

U.S. PATENT DOCUMENTS
4,831,631 A   5/1989   Haeussler et al.
(Continued)

FOREIGN PATENT DOCUMENTS
JP   63-91624 A   4/1988

OTHER PUBLICATIONS
S. Sudo, et al., "External Cavity Wavelength Tunable Laser Utilizing On-Chip VOA", Technical Digest of Optical Fiber communication conference and Exposition 2006, OWL 4.

Primary Examiner — Brian M. Healy
Assistant Examiner — Guy Anderson
(74) Attorney, Agent, or Firm — Sughrue Mion, PLLC

(57) ABSTRACT

A first exemplary aspect of the present invention is a wavelength-tunable optical transmitter including: a semiconductor substrate (101); a wavelength-tunable light source that is formed on the semiconductor substrate (101) and includes at least a first reflector (102) of a wavelength-tunable type and a gain region (104); a semiconductor optical modulator formed on the semiconductor substrate (101); a first semiconductor optical waveguide (105c) that is formed on the semiconductor substrate (101) and smoothly connected to the wavelength-tunable light source; a second semiconductor optical waveguide (105d) that is formed on the semiconductor substrate and smoothly connected to the semiconductor optical modulator; a waveguide coupling region (108) in which the first and second semiconductor optical waveguides are collinearly coupled with a length $L_C$ that is not equal to m/2 (m: integer) times a complete coupling length $L_{C0}$; and a second reflector (113) formed at an end of the waveguide coupling region (108).

8 Claims, 2 Drawing Sheets

U.S. PATENT DOCUMENTS

| | | | |
|---|---|---|---|
| 5,325,392 A * | 6/1994 | Tohmori et al. | 372/96 |
| 5,844,926 A * | 12/1998 | Byron et al. | 372/6 |
| 5,862,162 A * | 1/1999 | Maeda | 372/20 |
| 6,115,520 A * | 9/2000 | Laskowski et al. | 385/50 |
| 6,987,784 B2 * | 1/2006 | Woodley et al. | 372/20 |
| 7,145,709 B1 * | 12/2006 | Westfall et al. | 359/273 |
| 7,436,867 B2 * | 10/2008 | McDonald et al. | 372/29.022 |
| 7,539,369 B2 * | 5/2009 | Yamazaki | 385/14 |
| 2002/0048289 A1 * | 4/2002 | Atanackovic et al. | 372/20 |
| 2004/0101016 A1 * | 5/2004 | McDonald et al. | 372/97 |
| 2011/0075688 A1 * | 3/2011 | Chiang et al. | 372/12 |
| 2012/0057610 A1 * | 3/2012 | Dallesasse et al. | 372/20 |

* cited by examiner

WAVELENGTH-TUNABLE OPTICAL TRANSMITTER

TECHNICAL FIELD

The present invention relates to a wavelength-tunable optical transmitter.

BACKGROUND ART

Along with an explosive increase in demand of a broadband multimedia communication service such as the Internet or a high-definition digital TV broadcast, a dense wavelength-division multiplexing optical fiber communication system, which is suitable for a long-distance and large-capacity transmission and is highly reliable, has been introduced in trunk networks and metro networks. Also in access networks, optical fiber access services have spread rapidly. In such an optical fiber communication system, reduction in costs for laying optical fibers as optical transmission lines and improvement in spectral efficiency per optical fiber are required. Therefore, a wavelength-division multiplexing technology which multiplexes multiple optical signals having different wavelengths is widely used.

In an optical transmitter for such a high-capacity wavelength-division multiplexing communication system, an optical modulator is a key component. In the optical modulator, high speed operation with small wavelength dependence is indispensable. Further, an unwanted optical phase modulation component (in the case of generating an optical intensity modulation signal) or an optical intensity modulation component (in the case of generating an optical phase modulation signal) which degrades the waveform of the received optical signal after long-distance transmission should be suppressed as small as possible. A Mach-Zehnder (MZ) optical intensity modulator in which a couple of waveguide type optical phase modulators are embedded into an MZ interferometer is suitable for such a use.

A waveguide type semiconductor optical phase modulator or a semiconductor MZ optical modulator using a III-V compound semiconductor such as gallium arsenide (GaAs) or indium phosphide (InP) in a light source are expected to realize downsizing and cost reduction by monolithic integration. Downsizing and cost reduction are significantly important to put an optical transmitter for a wavelength-division multiplexing optical fiber communication system into practical use.

By the way, a wavelength-tunable light source generally includes a resonator structure in which a reflector having a wavelength-tunable mechanism and a reflector having small (or no) wavelength dependence are arranged at both ends of a gain region which generates signal light. The reflector having the above-mentioned wavelength-tunable mechanism can be categorized into two types. One is a reflector in which a semiconductor optical waveguide type ring optical resonator or a Bragg reflector is monolithically integrated with a gain region. The other is a reflector in which a diffraction grating having wavelength selectivity is provided outside and coupled to a gain region by a lens. As the reflector having small wavelength dependence, a cleavage surface of the semiconductor optical waveguide can be used.

When the waveguide type semiconductor optical modulator is monolithically integrated with the wavelength-tunable light source, it is necessary to provide a reflector having small wavelength dependence between them. The reflector is required to reflect a certain amount of light and couple the signal light from the wavelength-tunable light source to the optical modulator at a practical rate. Further, in order that the optical modulator region and the wavelength-tunable light source region, which are monolithically integrated, operate independently, or in order that each control signal does not influence other control signals, the optical modulator region and the wavelength-tunable light source region should be electrically isolated from each other. Thus, there is proposed a structure (narrow gap mirror) in which a gap with a length of about a signal light wavelength is formed in the optical waveguide connecting the wavelength-tunable light source and the optical modulator which are monolithically integrated (refer to Non-Patent Document 1, for example). The narrow gap mirror can be formed by dry etching technology.

However, there are some problems in putting the narrow gap mirror into practical use. Firstly, the wavelength-tunable light source and the optical modulator are required to be directly aligned in a longitudinal direction. Therefore, the monolithically integrated device tends to be long, which is a disadvantage in downsizing, fabrication yield, and the like. Further, a high processing accuracy of about 0.1 µm is required.

Further, it is difficult to control an etching depth because an etch stop mask is required to cover the surface of a semiconductor substrate at an extremely high rate. In addition, acceptance/rejection determination is difficult because it is difficult to observe the inside of an etched gap.

Further, in a discontinuous portion of the optical waveguide such as the gap mirror, the signal light is scattered. Therefore, it is difficult to improve the signal light coupling efficiency between the wavelength-tunable light source region and the optical modulator region. The signal light scattered by such a gap mirror is transmitted to the vicinity of a signal light output end face through the semiconductor substrate as non-guided light. Thus, extinction properties as an optical modulator are degraded. For example, to prevent such scattering, a resin having a proper refractive index may be filled into the narrow gap mirror. However, heat treatment of the resin and optimization of forming conditions for an underlaying film are difficult. Thus, there are some problems in correction of reflection-transmission characteristics and reliability. Further, there is a concern about contamination of a process unit by the resin. In addition, the reflection-transmission characteristics are determined in a preceding process. Thus, adjustment and yield recovery are difficult in a later process.

Further, exposing the worked surface (the end face of the optical waveguide) at which the narrow gap mirror is formed leads to the reliability problem. On the other hand, it is difficult to form a dielectric protection film on the worked surface in view of controlling a coating shape and uniformity.

[Non-Patent Document 1] S. Sudo and six others, "External Cavity Wavelength Tunable Laser Utilizing On-Chip VOA", Technical Digest of Optical Fiber Communication Conference and Exposition 2006, OWL4

DISCLOSURE OF INVENTION

Technical Problem

As mentioned above, a wavelength-tunable optical transmitter using a narrow gap mirror has some problems in downsizing, fabrication yield, and reliability.

An object of the present invention is to provide a wavelength-tunable optical transmitter which is downsized and excellent in fabrication yield and reliability, and in which a wavelength-tunable light source and an optical modulator are monolithically integrated.

Technical Solution

An exemplary aspect of the present invention is a wavelength-tunable optical transmitter including: a semiconductor substrate; a wavelength-tunable light source that is formed on the semiconductor substrate and includes at least a first reflector of a wavelength-tunable type and a gain region; a semiconductor optical modulator formed on the semiconductor substrate; a first semiconductor optical waveguide that is formed on the semiconductor substrate and smoothly connected to the wavelength-tunable light source; a second semiconductor optical waveguide that is formed on the semiconductor substrate and smoothly connected to the semiconductor optical modulator; a waveguide coupling region in which the first and second semiconductor optical waveguides are collinearly coupled with a length $L_C$ that is not equal to m/2 (m: integer) times a complete coupling length $L_{C0}$; and a second reflector formed at an end of the waveguide coupling region.

ADVANTAGEOUS EFFECTS

According to exemplary aspects of the present invention, it is possible to provide a wavelength-tunable optical transmitter which is downsized and excellent in fabrication yield and reliability, and in which a wavelength-tunable light source and an optical modulator are monolithically integrated.

EXPLANATION OF REFERENCE

Figure 1:
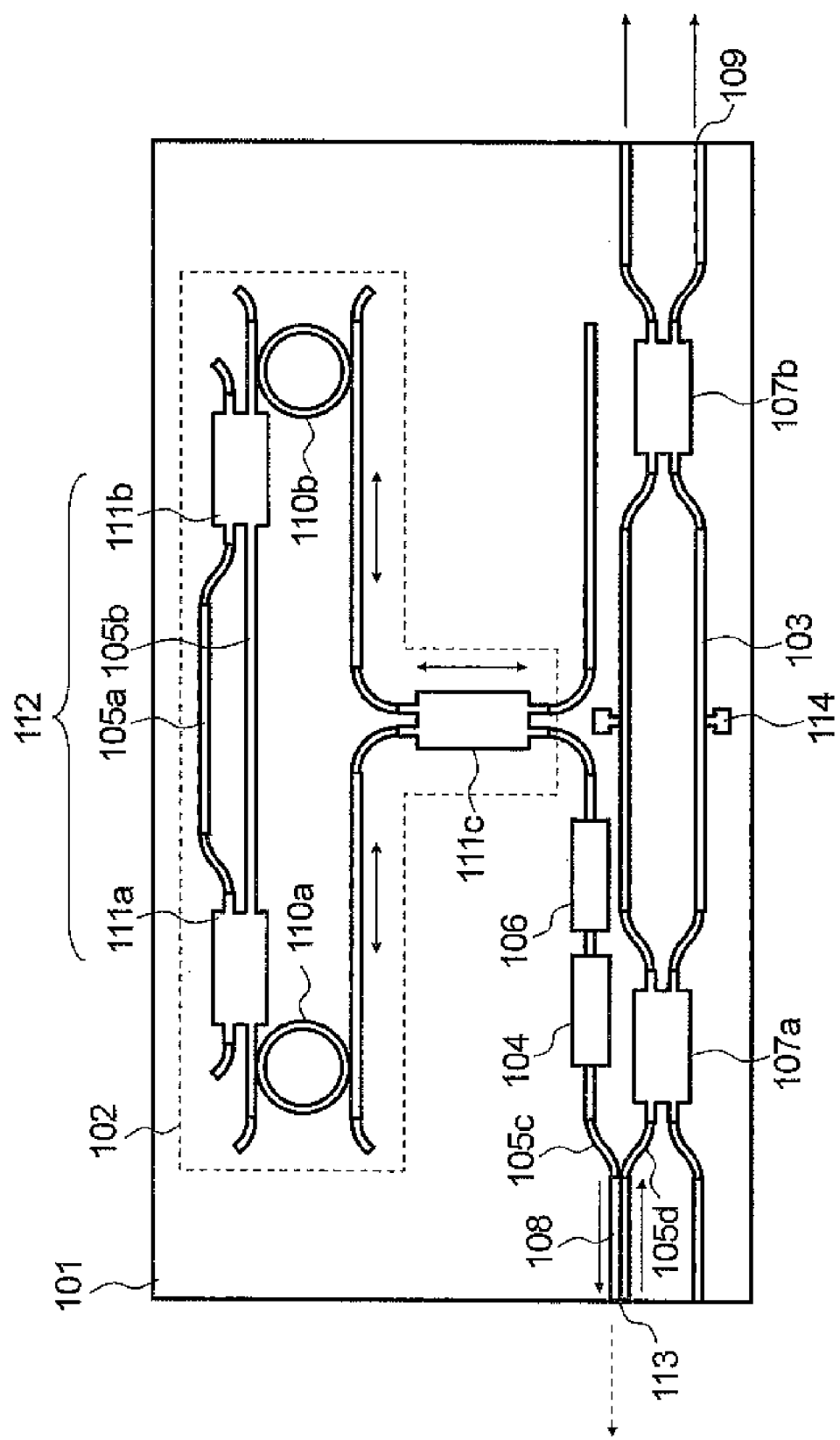
FIG. 1 is a plan view showing a structure of a wavelength-tunable optical transmitter according to a first embodiment of the present invention.

101 SEMICONDUCTOR SUBSTRATE
102 WAVELENGTH-TUNABLE REFLECTOR
103 LOWER CLADDING LAYER
104 GAIN REGION
105, 105a~105d WAVEGUIDE
106 PHASE CONTROL REGION
107a, 107b, 111a, 111b, 111c OPTICAL MULTIPLEXER/DEMULTIPLEXER
108 COUPLING REGION
109 LOW REFLECTING FILM
110a, 110b OPTICAL RESONATOR
112 OPTICAL BANDPASS FILTER
113 HIGH REFLECTING FILM
114 ELECTRODE
115 PHOTODETECTOR

BEST MODE FOR CARRYING OUT THE INVENTION

The problems inherent of the narrow gap mirror are just caused by coupling the signal light between the end face of the optical waveguide of the wavelength-tunable light source and the end face of the optical waveguide of the optical modulator which are monolithically integrated on a single semiconductor substrate. Through his extensive research, the inventor reviewed means for coupling the signal light between two optical waveguide type devices monolithically integrated on a single semiconductor substrate and coupled both the optical waveguide type devices collinearly. Further, the inventor set the length of the coupling region properly and introduced a reflection structure having a limited reflectance at an end face of the optical waveguide. The mirror structure functions as a reflector which has a small wavelength dependence and is necessary for the reflection wavelength-tunable light source. In addition, the mirror structure functions as an optical coupler for coupling both regions.

By the reflector provided at the end of the optical waveguides collinearly coupled to each other, a part of the signal light output from the wavelength-tunable light source is fed back to itself. The rest of the signal light is coupled to the optical modulator region.

A reflectance R to the wavelength-tunable light source and a transmittance T to the optical modulator are both functions $R(L_C)$ and $T(L_C)$ of a length $L_C$ of a collinear coupling region.

Here, by setting the length $L_C$ to meet the expression $L_C \neq (m/2) \times L_{C0}$ ($L_{C0}$: complete coupling length), a certain reflection at the end face necessary for laser oscillation of the wavelength-tunable light source can be ensured. Then, the signal light can also be transmitted to the optical modulator.

The ratio of the reflectance R ($L_C$) to the transmittance T ($L_C$) can be adjusted by a position (coupling region length $L_C$) at which the coupling portion is cleaved after completion of the process. By designing the optical waveguide structure of the collinear coupling region properly, the cleave position accuracy can be loosened to a practical value (about ±5 μm, for example) which is feasible by an auto cleaver in a mass production line. In a similar way, over a relatively wide waveband, the reflectance R ($L_C$) and the transmittance T ($L_C$) may be set to be a value constant within a range having no trouble in a practical use. Thus, no wavelength dependence is expected, which is practical as a reflector and an optical coupler.

Further, the absolute value and wavelength dependence of the reflectance R ($L_C$) and the transmittance T ($L_C$) can be controlled by providing a dielectric film at the end face. For example, by forming the dielectric film of a single layer, the practical reflectance and the waveband (C band corresponding to about 1525 to 1565 nm, for example) as the wavelength-tunable light source can be covered.

As mentioned above, these parameters are adjustable in a later process. Therefore, the fabrication yield is expected to be higher than that of the narrow gap mirror in which strict dimensional accuracy is required and reflectance and transmittance are fixed in a preceding process.

In addition, by setting the limited reflectance of less than 1, a part of the signal light power leaking from the end face of the optical waveguide is coupled to a photodetector, thereby enabling evaluation of the optical output from the wavelength-tunable light source exactly. This is significantly useful for performing the automatic power control (APC).

Further, conventionally, the wavelength-tunable light source and the optical modulator are required to be linearly arranged through the gap mirror. For this reason, in the present invention, a folding structure makes it possible to shorten the length of the monolithic integrated device. In addition, improvement of the fabrication yield in commercial mass production and downsizing of the module are expected. Further, the folding structure has a feature that the signal light output from the wavelength-tunable light source can be monitored from the opposite side of the optical modulation output. Thus, the folding structure has advantages in high flexibility of the mounting position of the photodetector in the wavelength-tunable optical transmitter module and downsizing of the module.

In a similar way, the folding structure can eliminate the scattering light, which is the problem of the narrow gap mirror, in principle. Moreover, the signal light component passing through the reflector is not transmitted to the optical modulator through the semiconductor substrate as non-guided light. Therefore, modulation properties are excellent because the degradation in extinction ratio due to the scattering light hardly occurs in principle.

Further, for introducing the folding mirror structure, no new fabrication process is required and it is only necessary to modify the mask pattern. Therefore, the established fabrication technology can be applied as it is and fabrication costs can be reduced.

Also, with regard to electrical isolation between the wavelength-tunable light source and the optical modulator, practical properties are expected by modifying the layer structure of the semiconductor optical waveguide and by using methods such as an isolation trench and ion implantation.

Further, the need for the resin to fill the gap, which is practically essential for the use of the previous narrow gap mirror, is eliminated. This is advantageous in that contamination of semiconductor fabrication equipment which may influence the reliability of the device can be prevented.

In a similar way, the need for the etch stop mask, which is required to cover almost the entire surface of the semiconductor substrate except for the narrow gap portion necessary for the use of the previous narrow gap mirror, is also eliminated. Therefore, the fabrication yield is expected to improve because it is not influenced by the covering ratio of the etch stop mask and the inside shape after etching.

In a similar way, the need for observation of the inside of the etched gap, which is difficult when only a narrow region such as the previous narrow gap mirror is etched, is eliminated. Therefore, it is expected to reduce the fabrication costs by skipping the inspection process.

As mentioned above, monolithic integration and downsizing of the module can be realized by coupling means for coupling the wavelength-tunable light source and the optical modulator of the present invention without degrading oscillating operation of the wavelength-tunable light source and optical modulation performance of the optical modulator region. Further, it is expected to reduce the fabrication costs by improving the fabrication yield, skipping the inspection process, and the like.

Exemplary embodiments of the present invention will be described in detail below with reference to the accompanying drawings. Note that the present invention is not limited to exemplary embodiments described below. The following descriptions and drawings are simplified as appropriate to clarify the explanation.

First Embodiment

Next, a first embodiment of the present invention is described in detail with reference to the drawings. FIG. 1 is a plan view showing a structure of a wavelength-tunable optical transmitter according to the first embodiment of the present invention. The structure is described in turn below.

In the wavelength-tunable optical transmitter, a wavelength-tunable light source and an MZ optical modulator are monolithically integrated on a single semiconductor substrate 101. The wavelength-tunable light source includes a gain region 104, a phase control region 106, and a wavelength-tunable reflector 102. The components are connected by waveguides 105.

Here, the wavelength-tunable reflector 102 includes a pair of semiconductor optical resonators 110a, 110b having free spectral ranges slightly different from each other, an optical bandpass filter 112 to which an asymmetric MZ interferometer is applied, and a multiplexer/demultiplexer 111c. In the optical bandpass filter 112, a pair of multiplexer/demultiplexers 111a, 111b are connected to each other through a pair of waveguides 105a, 105b having different lengths. In unused input/output ports of the multiplexer/demultiplexers 111a, 111b, reflection-free termination is processed by curving a pair of waveguides 105 and tapering them toward their tips. Further, in the vicinity of both ends of the optical bandpass filter 112, the waveguides 105 constituting the optical bandpass filter 112 are connected to the semiconductor optical resonators 110a, 110b, respectively. Each of the semiconductor optical resonators 110a, 110b is also connected to a waveguide 105 which is formed substantially in parallel to the waveguides 105 constituting the optical bandpass filter 112. The waveguides 105 are connected to each other through the multiplexer/demultiplexers 111c.

In the MZ optical modulator, a pair of two-input/two-output optical multiplexers/demultiplexers 107a, 107b are smoothly connected to both ends of an optical phase modulation region 103 composed of a pair of waveguides. An output optical waveguide 105c of the wavelength-tunable light source and an input optical waveguide 105d of the optical modulator region are collinearly coupled to each other in a coupling region 108. At an end face of the coupling region 108, a high reflecting film 113 composed of a dielectric material and the like is provided. On the other hand, a low reflecting film 109 is provided at an end face of the output side of the optical modulator region.

Next, operation of the wavelength-tunable optical transmitter shown in FIG. 1 is described. Arrows in FIG. 1 indicate flows of signal light.

By injecting a current into the gain region 104, the wavelength-tunable light source oscillates laser light with a certain wavelength in a single axial mode. The oscillation wavelength is determined by resonance conditions of the pair of semiconductor optical resonators 110a, 110b in the wavelength-tunable reflector 102. This resonance wavelength can be controlled by injecting a current into a heating electrode (not shown) provided at the semiconductor optical resonators 110a, 110b and by controlling a temperature of the heating electrode. Further, in order to obtain a stable single-axial-mode laser oscillation state, it is also necessary to control phase matching conditions. Therefore, the phase control region 106 is provided. The signal light output from the wavelength-tunable light source oscillating the laser light is guided to the coupling region 108 through the optical waveguide 105c which is smoothly connected to the phase control region 106.

The high reflecting film 113 necessary for laser oscillation is formed at an end face of the coupling region 108. Reflection at the high reflecting film 113 is controlled by a length of the coupling region 108. In addition, it can be controlled also by a thickness and a refractive index of the high reflecting film 113 provided at the end face. Reflectance at the high reflecting film 113 can be deemed nearly constant over a wide waveband within a range having no trouble in a practical use. Further, a part of the signal light leaks from the high reflecting film 113 having a limited reflectance of less than 1. On the other hand, the power of the rest of the signal light is coupled to the optical modulator. Then, when a modulation electrical signal is applied to the optical phase modulation region 103 of the optical modulator, a light-modulation output is emitted from the low reflecting film 109.

FIRST EXAMPLE

Next, a mode for the invention 1 of the wavelength-tunable optical transmitter according to the first embodiment of the present invention is described with reference to FIG. 1. In the wavelength-tunable optical transmitter according to the mode for the invention 1, a wavelength-tunable light source and an MZ type optical modulator are monolithically integrated on a semi-insulating type semiconductor substrate 101 composed of InP.

A gain region 104 of the wavelength-tunable light source is composed of a semiconductor optical amplifier having a length of 450 μm and having a structure sandwiching an undoped InGaAsP/InGaAsP multiple quantum well active layer (10 well layers, a gain peak wavelength of 1550 nm) between a p-InP upper cladding layer and an n-InP lower cladding layer.

A wavelength-tunable reflector 102 is an optical resonator based on a semiconductor optical waveguide structure sandwiching a gain region composed of an undoped AlGaInAs/AlGaInAs multiple quantum well core layer (16 well layers, a transition wavelength of 1390 nm) between a Ru doped InP upper cladding layer with a p-InP electron barrier layer from an upper side and an n-InP lower cladding layer from a lower side. The wavelength-tunable reflector 102 is a combination of a pair of semiconductor disk type optical resonators 110a, 110b having free spectral ranges slightly different from each other and an optical bandpass filter 112 to which an asymmetric MZ interferometer is applied. On the surfaces of the pair of semiconductor disk type optical resonators 110a, 110b and the optical bandpass filter 112, a heating electrode (not shown) is provided. Each resonance wavelength is controlled by injecting a current to the heating electrode.

In the optical modulator, a pair of two-input/two-output multimode interference type optical multiplexer/demultiplexers 107a, 107b are smoothly connected to both ends of a pair of optical phase modulation regions 103 with a length of 2.5 mm. The optical phase modulation region 103 is based on a semiconductor optical waveguide structure sandwiching a gain region composed of an undoped AlGaInAs/AlGaInAs multiple quantum well core layer (16 well layers, a transition wavelength of 1390 nm) between an n-InP upper cladding layer with a p-InP electron barrier layer from an upper side and an n-InP lower cladding layer from a lower side.

Further, other multimode interference type optical multiplexers/demultiplexers and passive optical waveguides are based on a semiconductor optical waveguide structure sandwiching a gain region composed of an undoped AlGaInAs/AlGaInAs multiple quantum well core layer (16 well layers, a transition wavelength of 1390 nm) between a Ru doped InP upper cladding layer with a p-InP electron barrier layer from an upper side and an n-InP lower cladding layer from a lower side. In the optical phase modulation region 103, an electrode 114 for applying a voltage is formed.

An output optical waveguide 105c of the wavelength-tunable light source and an input optical waveguide 105d of the optical modulator are collinearly coupled to each other with a distance of 1 μm and a length of 250 μm, which forms a coupling region 108. Further, at the opposite side, or at an end, a cleavage surface using a crystal face of the semiconductor substrate is formed. At an end face, a high reflecting film 113 with a reflectance of 90% is formed. On the other hand, a low reflecting film 109 with a reflectance of 0.05% is formed on an output end face of the optical modulator.

When a 30 mA current was injected into the gain region 104, this device oscillated laser light with a wavelength of 1550 nm in a single axial mode. Further, a wavelength tunable operation that covers a wide range from 1525 to 1565 nm was achieved by injecting a current into the pair of semiconductor disk type optical resonators 110a, 110b and the heating electrode of the optical bandpass filter 112, and by injecting a proper current into a phase control region 106. In addition, by applying a modulation electrical signal with a 150 mA gain current and a voltage swing of 2 Vp-p to the optical phase modulation region 103, an NRZ optical modulation operation with an optical output of +3 dBm and an extinction ratio of 25 dB was obtained The band of the optical modulator was 40 GHz, and 40 Gb/s optical modulation operation was observed.

Second Embodiment

Figure 2:
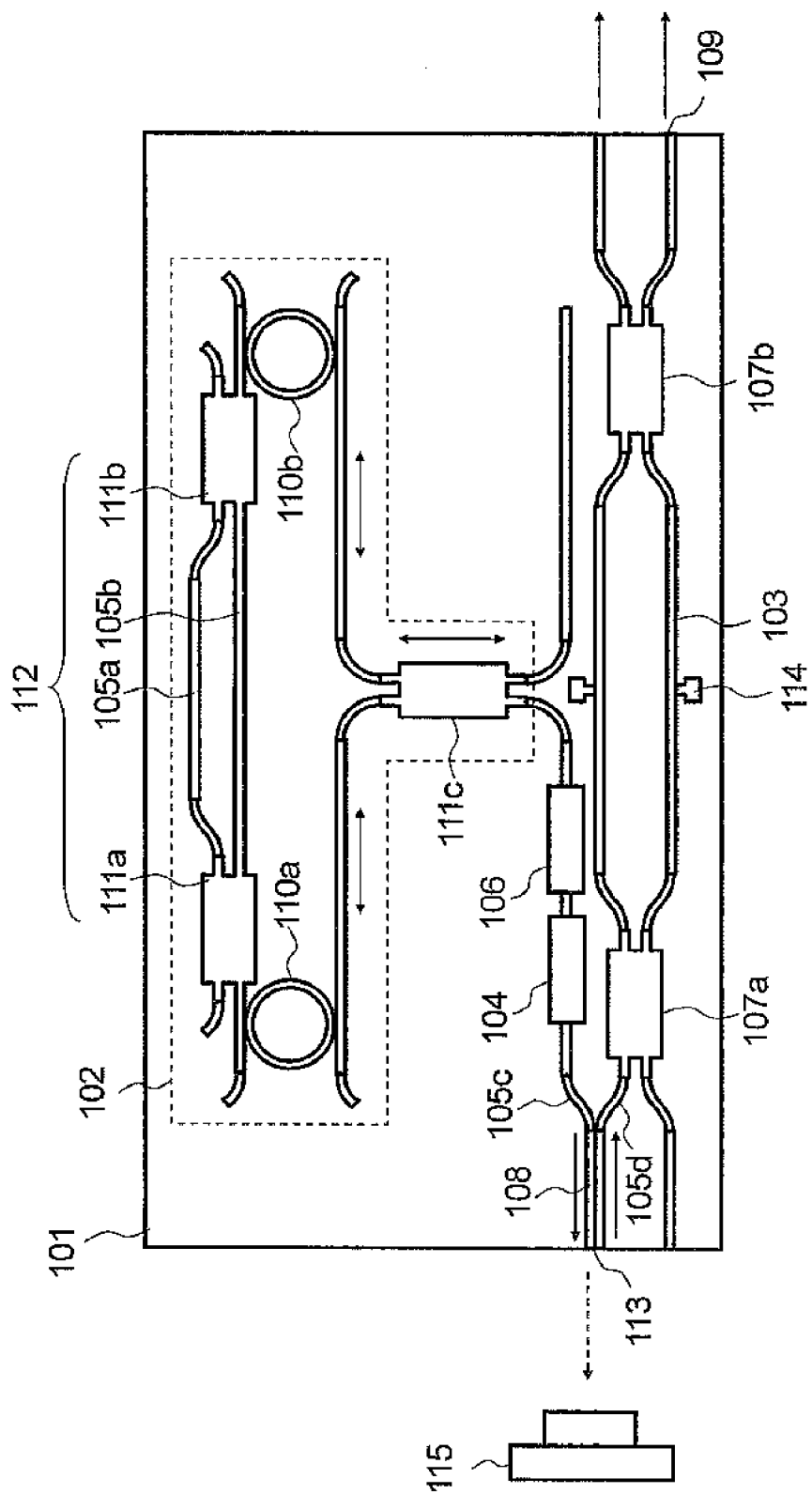
FIG. 2 is a plan view showing a structure of a wavelength-tunable optical transmitter according to a second embodiment of the present invention.

Next, a second embodiment of the present invention is described with reference to the drawings. FIG. 2 is a plan view showing a structure of a wavelength-tunable optical transmitter according to the second embodiment of the present invention. The difference from the first embodiment is that a photodetector 115 that monitors the strength of signal light leaking from the end face of the coupling region 108 is provided in the vicinity of the end face. The other configuration is the same as that of the first embodiment, and thus the explanation is omitted. According to the configuration of this embodiment, an optical output of the wavelength-tunable light source can be controlled by monitoring a photocurrent of the photodetector 115.

As described above, the wavelength-tunable optical transmitter according to the present invention can effectively solve problems such as downsizing and fabrication yield in realizing the ultra high speed optical modulator and the integrated optical device for the optical fiber communication system, particularly in trunk networks, by reviewing coupling means without changing the fabrication process. Therefore, downsizing, speeding-up, and lower power consumption are realized in the next generation optical fiber communication system.

According to a first effect of the present invention, further downsizing is achieved compared to the wavelength-tunable optical transmitter using the narrow gap mirror. The reason is that a flip-turn mirror according to the present invention can effectively shorten the device size.

According to a second effect of the present invention, the fabrication yield of the device is improved. The reason is that the process is drastically simplified compared with the complicated and sensitive fabrication process of the narrow gap mirror structure.

According to a third effect of the present invention, extinction properties are improved by the present invention. The reason is that the extinction ratio is not degraded because a waveguide discontinuity like the narrow gap mirror structure is not formed and the signal light scattered by the discontinuity is not transmitted in the direction of the output end of the optical modulator region.

Although the present invention has been described with reference to the embodiments, the present invention is not limited to the above embodiments. Various modifications can be made within the scope of the present invention.

This application is based upon and claims the benefit of priority from Japanese patent application No. 2008-203042, filed on Aug. 6, 2008, the disclosure of which is incorporated herein in its entirety by reference.

Industrial Applicability

The present invention is useful for fabrication and use of a wavelength-tunable optical transmitter, and for construction and use of various systems using the wavelength-tunable optical transmitter, for example. In addition, the present invention has various applicabilities in the technical fields of a communication technology, optics, and related technologies.

The invention claimed is:

1. A wavelength-tunable optical transmitter comprising:
   a semiconductor substrate;
   a wavelength-tunable light source that is formed on the semiconductor substrate and comprises at least a first reflector of a wavelength-tunable type, a second reflector, a gain region formed between the first and second reflectors, and a first semiconductor optical waveguide smoothly connected to the gain region and leading to the second reflector;
   a semiconductor optical modulator that is formed on the semiconductor substrate;
   a second semiconductor optical waveguide that is formed on the semiconductor substrate and smoothly connected to the semiconductor optical modulator; and
   a waveguide coupling region in which the first and second semiconductor optical waveguides are collinearly coupled to each other with a length $L_C$ that is not equal to m/2 (m: integer) times a complete coupling length $L_{C0}$,
   wherein the second reflector is formed at an end of the waveguide coupling region.

2. The wavelength-tunable optical transmitter according to claim 1, wherein the second reflector has a wavelength dependence smaller than that of the first reflector in a range of an oscillation wavelength of the wavelength-tunable light source.

3. The wavelength-tunable optical transmitter according to claim 1, wherein the second reflector is provided at an end face of the waveguide coupling region, the end face being formed by etching or cleavage.

4. The wavelength-tunable optical transmitter according to claim 3, wherein the second reflector is a reflection film provided at the end face.

5. The wavelength-tunable optical transmitter according to claim 1, further comprising a monitoring unit that monitors signal light passing through the second reflector.

6. The wavelength-tunable optical transmitter according to claim 1, wherein the first and second semiconductor optical waveguides are rib-type or ridge-type optical waveguides.

7. The wavelength-tunable optical transmitter according to claim 1, wherein the wavelength-tunable reflector comprises a semiconductor waveguide ring type optical resonator or a semiconductor disc type optical resonator.

8. The wavelength-tunable optical transmitter according to claim 1, wherein the first reflector utilizes a refractive index change by heat injection, current injection, or voltage application.

* * * * *